United States Patent
Latham et al.

(10) Patent No.: US 7,466,254 B2
(45) Date of Patent: Dec. 16, 2008

(54) SYSTEMS AND METHODS FOR DIGITAL CONTROL UTILIZING OVERSAMPLING

(75) Inventors: Paul Latham, Lee, NH (US); Stewart Kenly, Epping, NH (US)

(73) Assignee: L&L Engineering LLC, Lee, NH (US)

( * ) Notice: Subject to any disclaimer, the term of this patent is extended or adjusted under 35 U.S.C. 154(b) by 86 days.

(21) Appl. No.: 11/550,893

(22) Filed: Oct. 19, 2006

(65) Prior Publication Data

US 2007/0182610 A1 Aug. 9, 2007

Related U.S. Application Data

(60) Provisional application No. 60/765,099, filed on Feb. 3, 2006.

(51) Int. Cl.
*H03M 3/00* (2006.01)

(52) U.S. Cl. ........................ 341/143; 341/152; 341/155

(58) Field of Classification Search ................ 341/143, 341/152, 155
See application file for complete search history.

(56) References Cited

U.S. PATENT DOCUMENTS

| | | | |
|---|---|---|---|
| 5,432,693 A | 7/1995 | Anderson | |
| 5,594,324 A | 1/1997 | Canter et al. | |
| 6,081,216 A * | 6/2000 | May | 341/143 |
| 6,480,129 B1 * | 11/2002 | Melanson | 341/143 |
| 6,795,004 B2 * | 9/2004 | Masuda et al. | 341/143 |
| 6,833,691 B2 | 12/2004 | Chapuis | |
| 6,933,872 B2 * | 8/2005 | Kranz | 341/144 |
| 6,965,221 B2 | 11/2005 | Lipcsei et al. | |
| 6,972,704 B2 * | 12/2005 | Rivoir | 341/143 |
| 7,026,851 B2 | 4/2006 | Yang et al. | |
| 7,057,379 B2 | 6/2006 | Chapuis | |
| 7,081,740 B2 | 7/2006 | King | |
| 7,307,565 B1 * | 12/2007 | Melanson | 341/143 |
| 2003/0174005 A1 | 9/2003 | Latham, II et al. | |
| 2006/0023479 A1 | 2/2006 | Leung et al. | |
| 2006/0023781 A1 | 2/2006 | Leung et al. | |
| 2006/0062291 A1 | 3/2006 | Marotta et al. | |

FOREIGN PATENT DOCUMENTS

WO WO 03/079526 A2 9/2003

OTHER PUBLICATIONS

O'Malley, E. et al., A programmable digital pulse width modulator . . . , 19th Annual IEEE Applied Power Electronics Conf. and Exp, 2004, APEC '04, vol. 1, 53-59.
Lewison, R.S. et al., A Delta-sigma Pulse Width Modulator With Pulse Dithering, Symp on VLSI Circuits. Digest of Technical Papers., Jun. 12-14, 1997, 17-18.
Syed, A. et al. Digital pulse width modulator architectures, IEEE 35th Annual Power Electr. Spec. Conf. PESC 04. 2004, vol. 6, Jun. 20-25, 2004, 4689-4695.
Meijer, M. et al. On-chip digital power supply control . . . , Proc. of the 2005 Intl Symp on Low Power Electr. and Des. ISLPED '05, Aug. 8-10, 2005, 311-314.
Bibian, S. et al. High performance predictive dead-beat digital controller . . . , IEEE Trans. on Power Electronics, vol. 17(3) May 2002, 420-427.
Maksimovic, D. et al. Impact of digital control in power electronics, 16th Intl Symp on Power Semicond. Devices and ICs, Proc. ISPSD, May 24-27, 2004, 13-22.

* cited by examiner

*Primary Examiner*—Khai M Nguyen
(74) *Attorney, Agent, or Firm*—Burns & Levinson LLP; Orlando Lopez

(57) ABSTRACT

Methods and systems for digital control.

23 Claims, 19 Drawing Sheets

SYSTEMS AND METHODS FOR DIGITAL CONTROL UTILIZING OVERSAMPLING

CROSS REFERENCE TO RELATED APPLICATIONS

This application claims priority of U.S. Provisional Application 60/765,099 entitled "DIGITAL PWM CONTROLLER," filed on Feb. 3, 2006, which is incorporated by reference herein.

BACKGROUND

Applying digital methods to the control of systems bears the promise of creating new features, improving performance, providing greater product flexibility, and providing a lower cost. System operating characteristics dictated by a stored program, rather than the parameters of a set of discrete components, can result in cost and space savings as well as capacity for real time adaptation of those characteristics, greater sophistication in control algorithms and the ability to generate, store and recall valuable real-time functional data.

However, digital feedback control requires high resolution and high speed. These requirements have limited the adoption of digital control in many fields. The advent of low cost logic has it made possible the application of digital control techniques to cost sensitive fields. As the cost of digital logic decreases, new opportunities arise.

A typical digitally controlled feedback system has an analog to digital converter, digital loop compensator, power device driver, and an external system to be controlled. An example of a system in which application of digital control can improve performance or lower cost is the switching power supply or DC-to-DC converter. (However, many other systems would also benefit from application of digital control.)

It is very desirable to minimize the cost, size and power dissipation of a low-cost off-line switching power supply for low power applications, such as recharging cells and batteries used in portable consumer appliances, such as entertainment units, personal digital assistants, and cell phones, for example.

A PWM switched power supply requires a variable pulse width that is controlled by an error signal derived by comparing actual output voltage to a precise reference voltage. The pulse width of the switching interval must also be constrained to be within a minimum and maximum duration. These constraints are imposed for correct PWM power supply or motor driver operation.

An example of a digitally controlled system is shown in FIG. 1. In the example shown in FIG. 1, the system is a simple buck DC to DC converter. The fundamental components are the same for any DC to DC converter. The sample system shown in FIG. 1 includes three major components: a compensator preceded by an ADC, PWM and power switches, and passive LC network.

Typically the PWM resolution is required to be much higher than the ADC resolution. If this is not true, the output of the PWM jumps back and forth in code values to satisfy a particular input ADC code. The frequency of this jumping back and forth, which is commonly known as limit cycling, is determined by the control system dynamics. As a result the frequency and size of the ripple can be large. The typical solution to this problem is to increase the PWM resolution. This method can lead to significant complexity in the PWM Design. Techniques such as polyphase clocks or analog methods may be needed to achieve the required resolution. This is particularly true for high speed power supplies which require a very high speed PWM frequency.

There is a need for a digital controller that overcomes the requirements of high resolution and high speed.

There is also a need for a digital controller that can be implemented without expensive multiplication.

There is a further need for a digital controller that has the above characteristics and can have arbitrarily controlled coefficients.

There is also a need for simple, cost effective methods and systems that provide effectively high PWM resolution.

SUMMARY

In one embodiment, the digital controller of these teachings includes a modulating component capable of receiving an analog signal and providing an oversampled signals a compensating filter capable of receiving the oversampled signal, a low pass filter capable of receiving an output from the compensating filter and of providing a low pass filter output, and a sub sampling component capable of receiving the low pass filter output and of providing a subsampled output the subsampled output having a subsampled rate lower than a rate of the oversampled signal.

In another embodiment, the digital controller of these teachings includes a dither generating component capable of receiving an input signal having an input time resolution and of providing a dither output signal having a lower time resolution than the input time resolution, an average of the dither output signal being substantially equivalent to the input signal and a digital pulse width modulator capable of receiving the dither output signal and of providing a number of control pulses; the dither output signal determining at least one characteristic of the control pulses.

Other embodiments are within the scope of these teachings.

Embodiments of methods are also within the scope of these teachings and are disclosed.

For a better understanding of the present invention, together with other and further needs thereof reference is made to the accompanying drawings and detailed description and its scope will be pointed out in the appended claims.

DETAILED DESCRIPTION

While these teachings are described for particular embodiments of the system being controlled, many digital control system may use one aspect of these teachings, the digital controller of these teachings, and any PWM system may use a second aspect of these teachings, a PWM dither system.

It should be noted that while the exemplary power supply embodiment of these teachings is described by one exemplary type, other power supply architectures such as boost, buck-boost, flyback, forward, etc are within the scope of these teachings.

Figure 1:
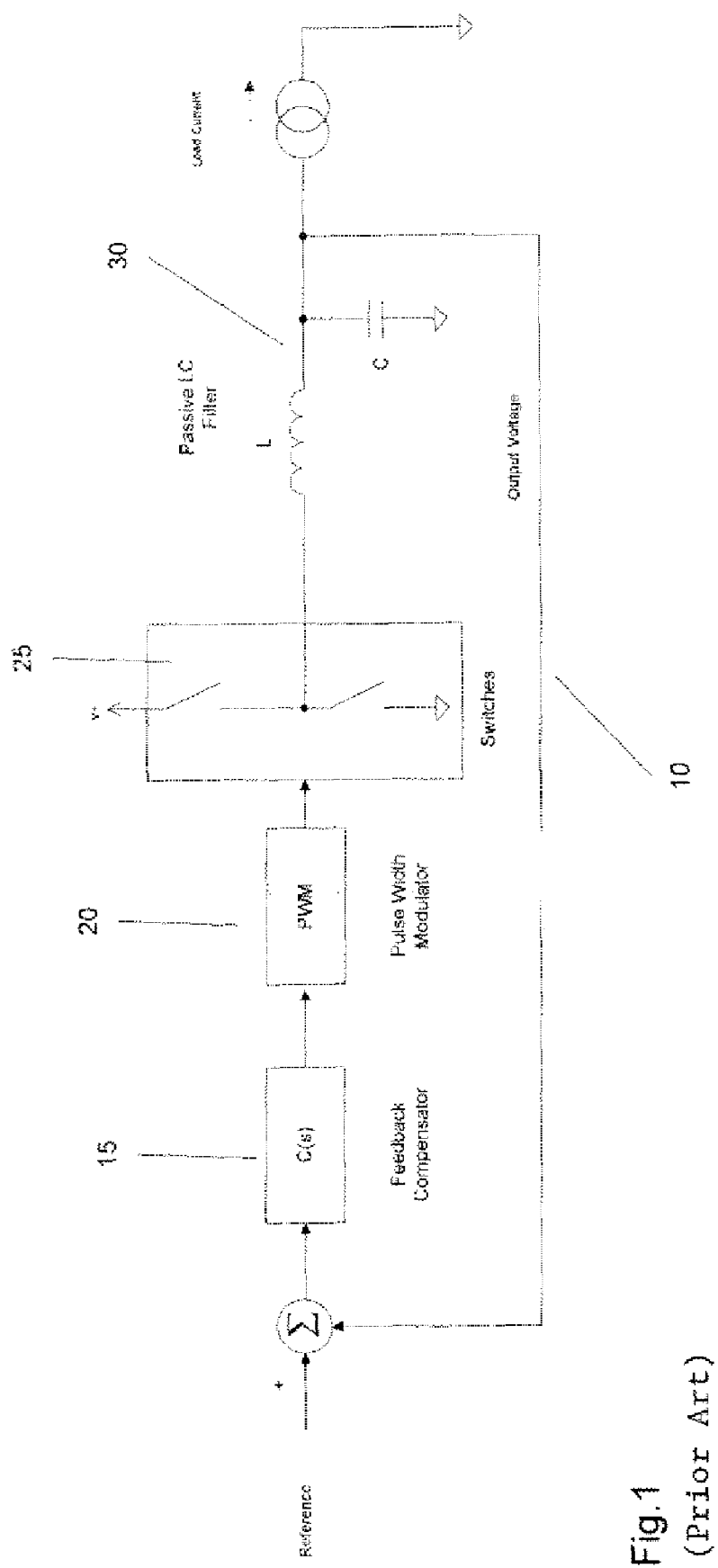
FIG. 1 shows a conventional single phase buck regulator.

FIG. 1 shows an example of a conventional digitally controlled system. In this example, the system is a simple buck DC to DC converter. The fundamental components are the same for any DC to DC converter. The conventional digitally controlled system 10 of FIG. 1 includes a feedback compensator 15 including an ADC and a compensating filter, a pulse width modulator 20, power switches 25, and passive LC network 30.

Figure 2:
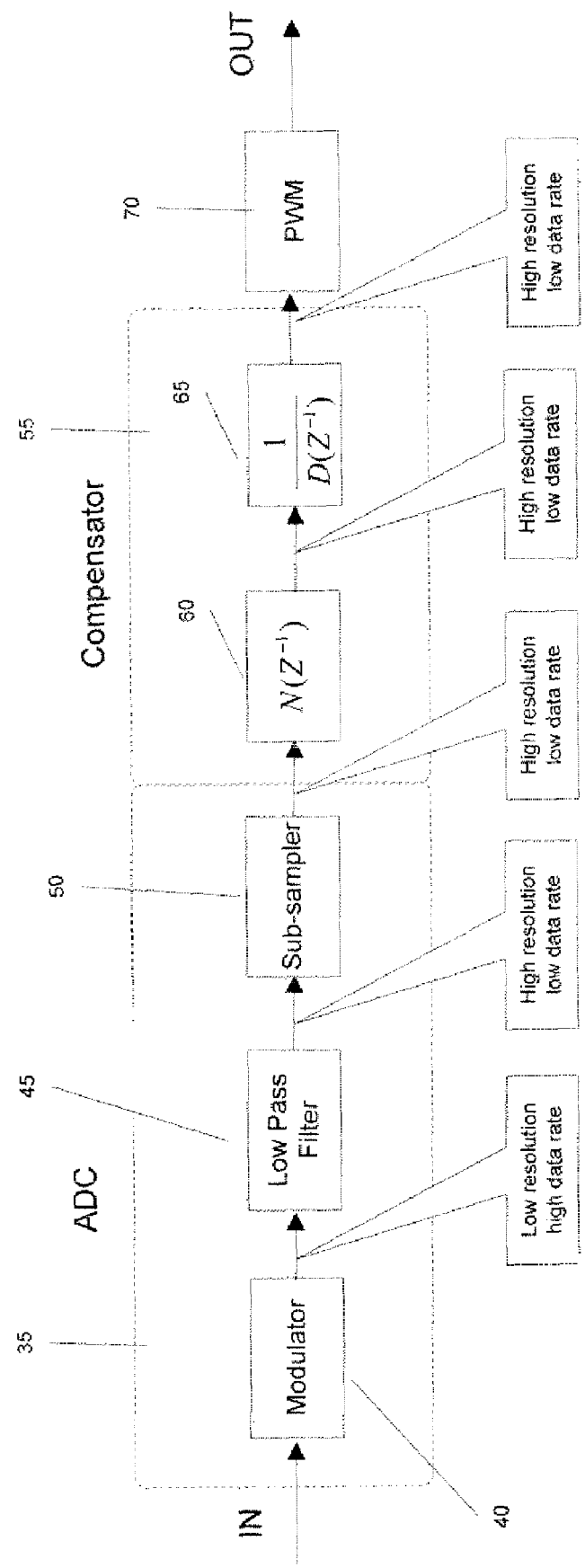
FIG. 2 shows a block diagram representation of an embodiment of a digital controller including an oversampling ADC and a compensating filter.

FIG. 2 shows a block diagram representation of an embodiment of a digital controller in which the feed back compensator 15 of FIG. 1 includes an oversampling ADC 35 and a compensating filter 55. The oversampling ADC 35 includes a modulating component 40 that receives an analog signal and provides an oversampled (low resolution, high data rate) signal, a low pass filter 45 that receives the oversampled (low resolution, high data rate) signal and provides a low pass filter output, and a subsampling component 50 that receives the low pass filter output and provides a subsampled output (high resolution, low data rate), the subsampled output having a rate lower than the rate of the oversampled signal. The subsampled output is provided to a compensator 55 (a compensating filter). The embodiment of the compensator 55 shown in FIG. 2 includes a first filter 60 including the numerator of the compensating filter 55, expressed by the z-transform $N(z^{-1})$, and a second filter 65 including the denominator, expressed by the z transform $D(z^{-1})$, of the compensating filter 55. The output of the compensating filter 55 is provided to a pulse width modulator 70 that provides a number of control pulses.

Figure 3:
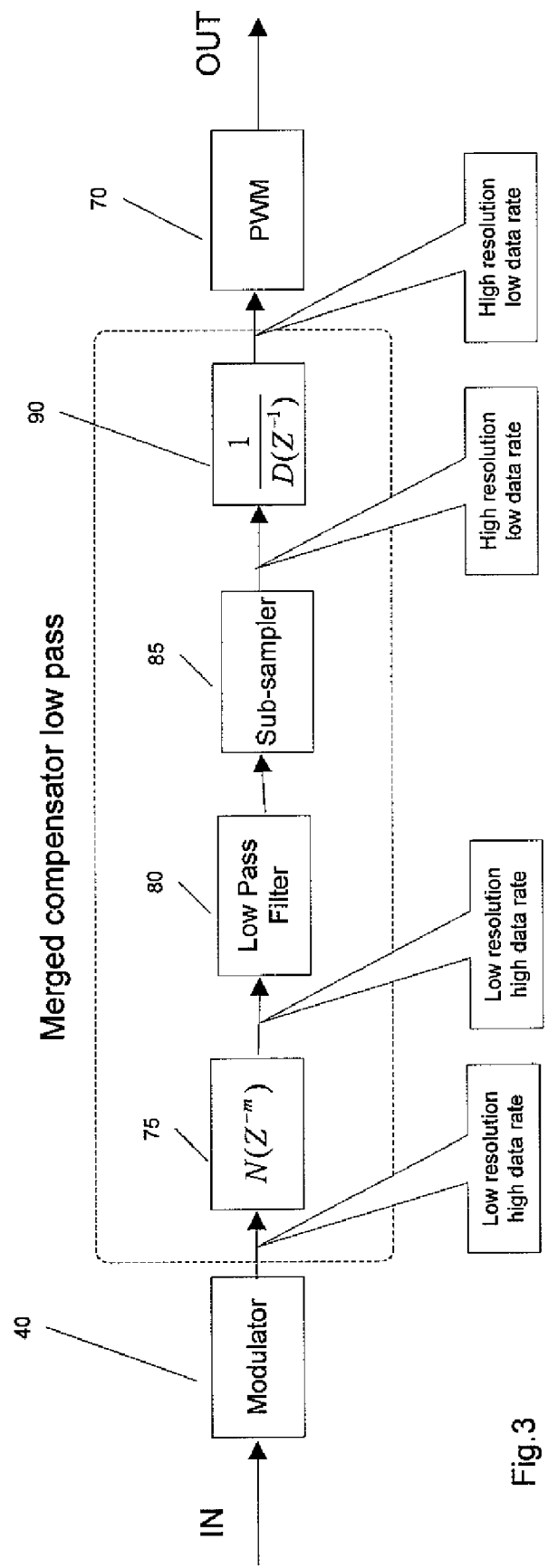
FIG. 3 shows a block diagram representation of an embodiment of a digital controller of these teachings.

FIG. 3 shows a block diagram representation of an embodiment of a digital controller of these teachings. In the embodiment shown in FIG. 3, a modulating component 40 that receives an analog signal and provides an oversampled (low resolution, high data rate) signal to a first compensating filter 75, which is expressed by the z transform in terms of the high sampling rate. The output of the first compensating filter 75 is provided to a low pass filter 80. The output of a low pass filter 80 is provided to a subsampler 85 that provides a subsampled output (high resolution, low data rate). The subsampled output is provided to a second compensating filter 90, which is expressed by the z transform in terms of the lower sampling rate. The compensated signal (the output of the second compensating filter 90) is provided to a pulse width modulator (PWM) 70. By reordering the compensating filter 55 of FIG. 2 such that the first compensating filter 75 in FIG. 3 includes the numerator of the compensating filter 55 of FIG. 2 and placing the first compensating filter 75 between the modulator 40 and the low pass filter 80, the compensator enjoys a oversampled low bitstream width data. As a result, logic complexity is lower, but logic clock speeds are higher and embodiments can be obtained in which the use of multipliers is reduced.

In one instance, the low pass 80 and the subsampler 85 can be combined into a low pass/decimating filter. The low pass 80 or the subsampler 85 or low pass/decimating filter can, in one embodiment, include a comb type filter with the nulls substantially at the PWM frequency and its harmonics.

It should be noted that embodiments such as those shown in FIG. 3 in which only the first compensating filter 75 is used are within the scope of these teachings. It should also be noted that embodiments in which the compensated output is provided to a control device other than a pulse width modulator are also within the scope of these teachings.

During operation of the embodiment of FIG. 3, an incoming signal is oversampled, resulting in a low resolution high data rate signal. The oversampled signal is compensated by means of a compensating filter and the compensated oversampled signal is low pass filtered and subsampled, resulting in a high resolution low data rate signal. In one embodiment, the high resolution low data rate compensated signal is provided as input to a pulse width modulator. In another embodiment, the high resolution low data rate compensated signal is further compensated and, in a PWM system, the further compensated low data rate signal is provided to the pulse width modulator.

Figure 4:
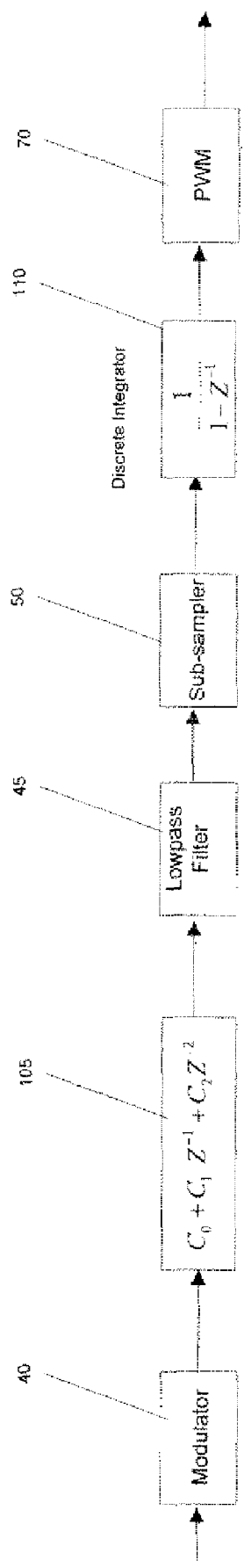
FIG. 4 shows a block diagram representation of a detailed embodiment of the digital controller of these teachings.

FIG. 4 shows an embodiment of the system of these teachings that implements a compensator equivalent to a conventional PID compensator but enjoying the advantages provided by these teachings. In the embodiment shown in FIG. 4, the first compensating filter 105 corresponds to the numerator of a conventional PID compensator, the second compensating filter 110 comprises a discrete integrator and the digital controller of these teachings corresponds to a conventional PID compensator.

Figure 5:
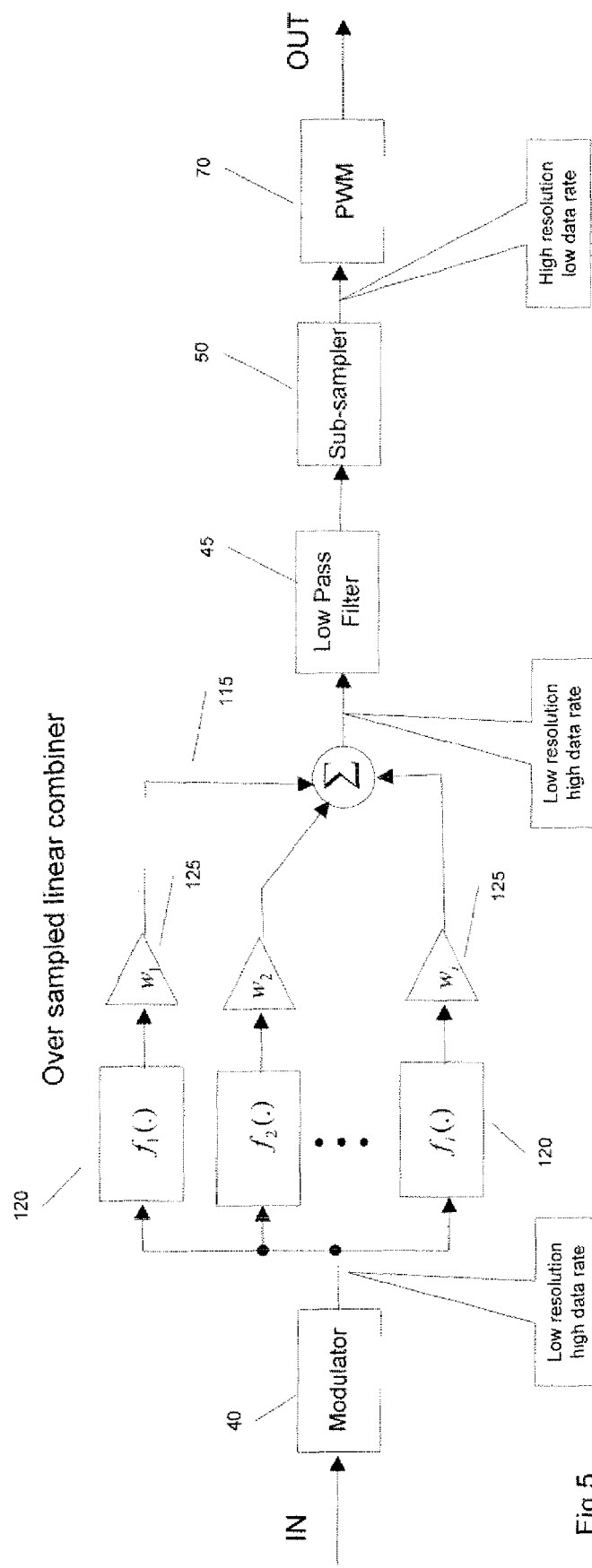
FIG. 5 shows a block diagram representation of yet another detailed embodiment of the digital controller of these teachings.

FIG. 5 shows an embodiment of the system of these teachings in which only a first compensating filter 115 is used and the first compensating filter 115 includes a number of sub-filters 120, the output of each sub-filter 120 being multiplied by a weight 125 from a number of weights and the output from the compensating filter 1115 being a sum of the weighted outputs.

Figure 6:
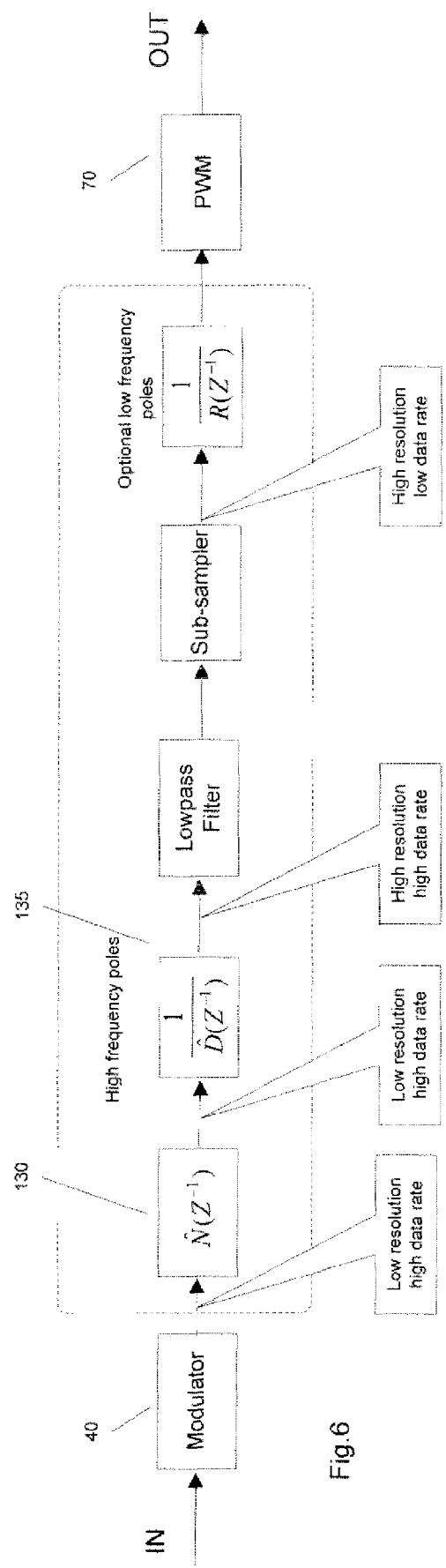
FIG. 6 shows a block diagram representation of a further embodiment of the digital controller of these teachings.

FIG. 6 depicts an embodiment of the system of these teachings in which the first compensating filter includes two sub-filters 130, 135. The first subfilter 130 the numerator of the compensating filter 55 of FIG. 2. The second subfilter 135 can in one embodiment includes the denominator of the compensating filter 55 of FIG. 2 and in another embodiment include only the high-frequency poles of the denominator of the compensating filter 55 of FIG. 2. In the second instance, the second compensating filter can include the low-frequency poles of the denominator of the compensating filter 55 of FIG. 2.

Figure 7:
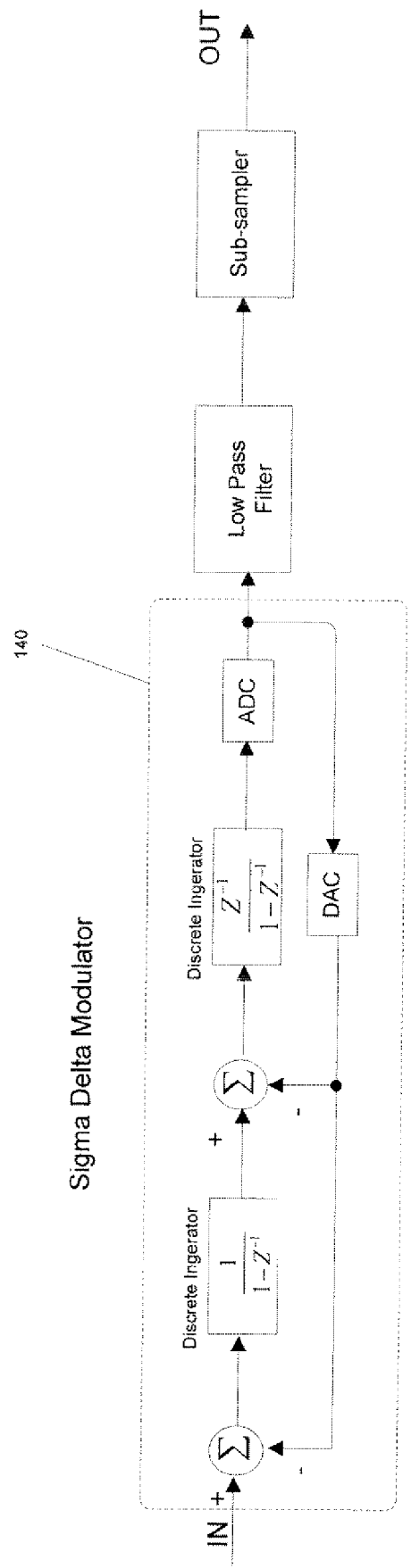
FIG. 7 shows a block diagram representation of a conventional second order Sigma Delta modulator.

In one embodiment, the modulator 40 of FIG. 3 is a Sigma Delta modulator 140. A conventional second order Sigma Delta modulator is shown in FIG. 7. It should be noted that a first order Sigma Delta modulator can also be utilized as the modulator 40 of FIG. 3.

Figure 8:
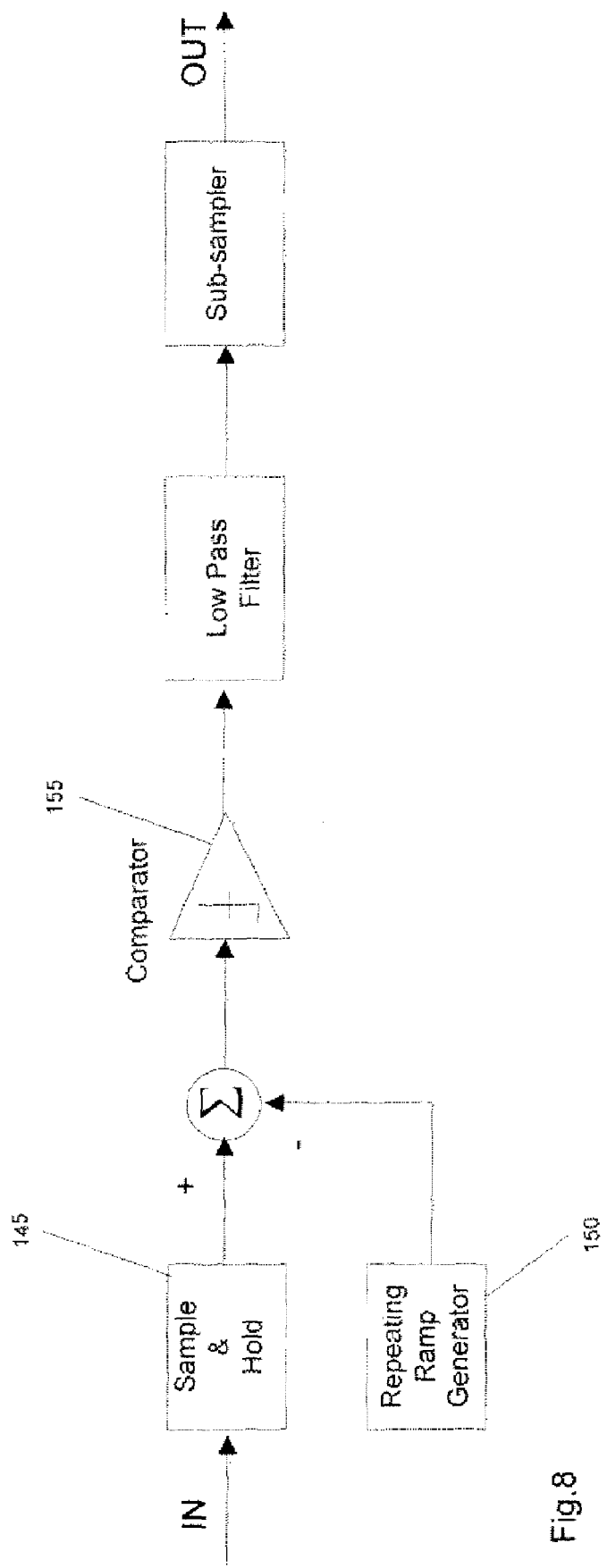
FIG. 8 depicts a block diagram representation of an embodiment of a component of the digital controller of these teachings.

In another embodiment, shown in FIG. 8, the modulator 40 of FIG. 3 comprises a sample on hold component 145 receiving the analog signal, a repeating ramp generator 150, the output of the repeating ramp generator 150 being subtracted from the output of the sample and hold component 145, and a comparator 155 receiving the difference from the output of the sample on hold component 145 and the output of the repeating ramp generator 150. In one instance, the repeating ramp generator 150 includes a voltage controlled oscillator (VCO), which can be a resettable voltage controlled oscillator. In such an instance, the modulator 40 includes a resetting component capable of resetting the modulator to lower resolution.

Figure 9:
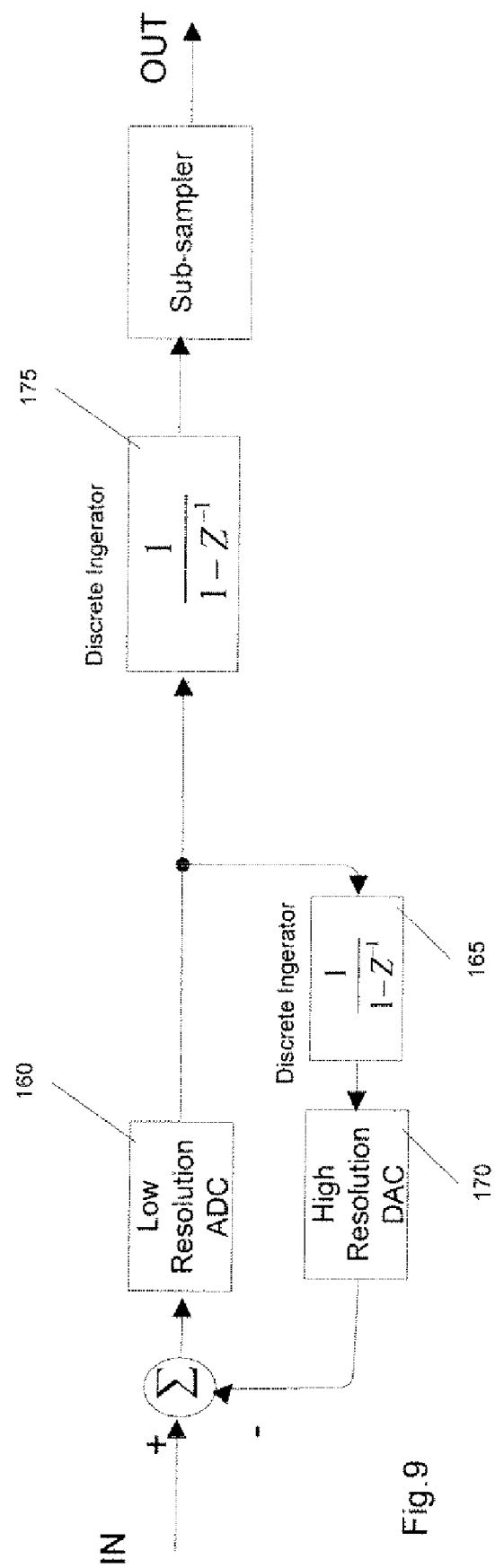
FIG. 9 depicts a block diagram representation of another embodiment of a component of the digital controller of these teachings.

In yet another embodiment, shown in FIG. 9, the modulator 40 of FIG. 3 comprises a high-speed digitally controlled analog loop. As shown in FIG. 9, the modulator 40 of FIG. 3 comprises a low resolution analog to digital converting component 160, an output of the low-resolution analog-to-digital converting component 160 being the oversampled signal, a discrete integrator 165 receiving the output of the low-resolution analog-to-digital converting component 160, a high resolution digital to analog converting component 170 receiving the output of the discrete integrator 165, the input to the low-resolution analog-to-digital converting component 160 being the difference between the input analog signal and the output of the high resolution digital to analog converting component 170. The sampling rate of the high-speed digitally controlled analog loop is selected to be sufficient to allow the input to be tracked. In the embodiment shown in FIG. 9, a discrete integrator 175 comprises the low pass filter and the compensating filter.

Figure 10:
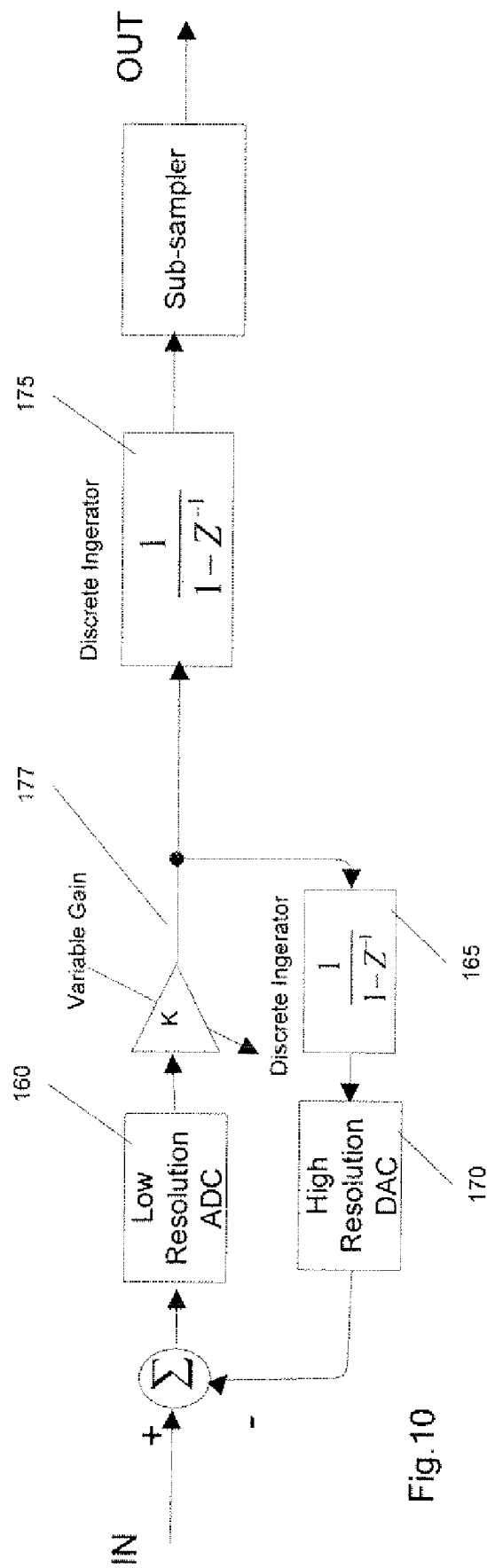
FIG. 10 depicts a block diagram representation of yet another embodiment of a component of the digital controller of these teachings.

In a further embodiment, shown in FIG. 10, a variable gain component 177 received the output of the low-resolution analog to digital converting component 160, the output of the variable gain component 177 being the over sampled signal. The discrete integrator 165 receives the output of the variable gain component 175. During operation of the embodiment shown in FIG. 10, a substantially high gain is utilized at the beginning of the period of the pulse width modulator and the gain is reduced at the end of the period of the pulse width modulator.

It should be noted that the embodiment shown in FIG. 10, when the discrete integrator 175 and the subsampler comprise a low pass filter/decimator constitutes an ADC that allows for fast conversion of the input signal that is near successive approximation in speed (~×2 slower) but also allows for slowly changing input without a sample & hold and still provides a sample delay that is of the fast clock.

Figure 11:
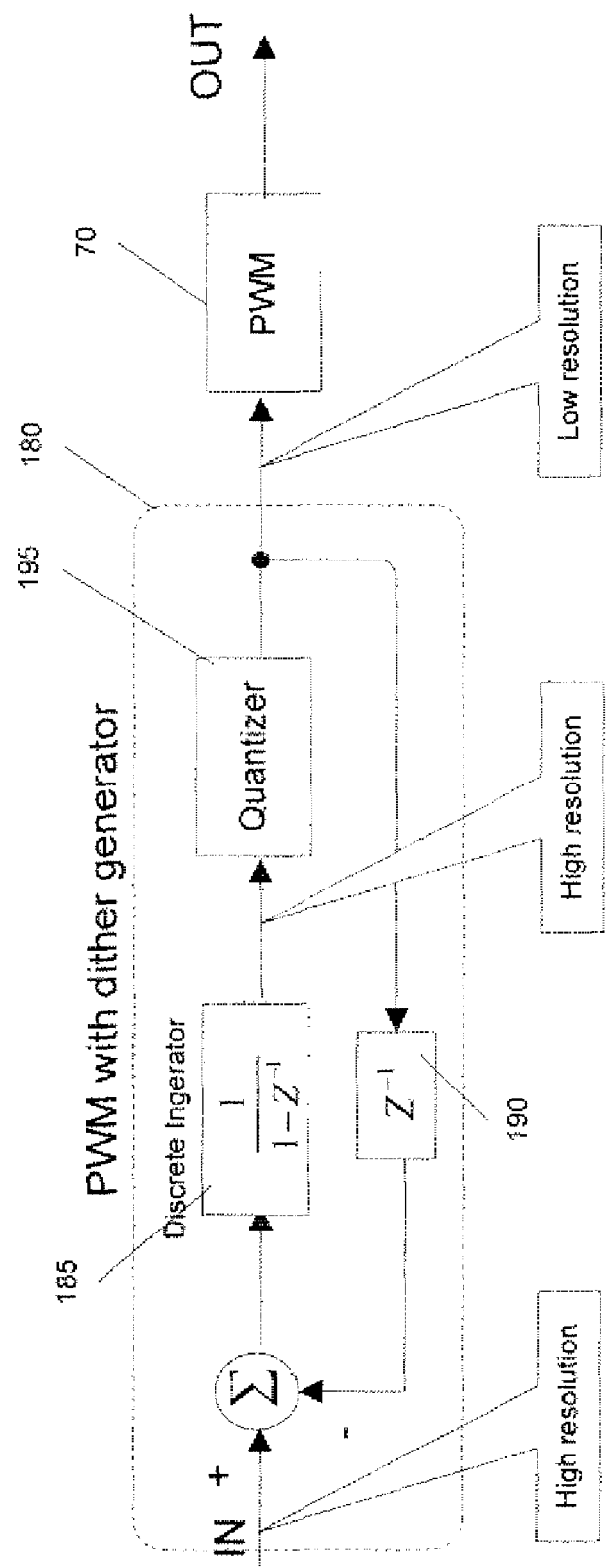
FIG. 11 shows a block diagram representation of another embodiment of a digital controller of these teachings.

FIG. 11 shows another embodiment of a digital controller of these teachings. The embodiment shown in FIG. 11 includes a dither generating component 180 capable of receiving an input signal and of providing a dither output signal having a lower time resolution than the input time resolution and a digital pulse width modulator 70 capable of receiving the dither output signal, the dither output signal determining at least one characteristic of the control pulses. In the instance shown in FIG. 11, the dither generating component 180 includes a quantizer 195 component that generates the dither output signal, a delay component 190 that receives the dither output signal (the delay component 190 is shown in terms of the z-transform of a delay) and provides a delayed dither output signal, and a discrete integrator component 185 that receives a difference between the subsampled signal and the delayed dither output signal and also provides a discrete integrator output to the quantizer 195.

Figure 12:
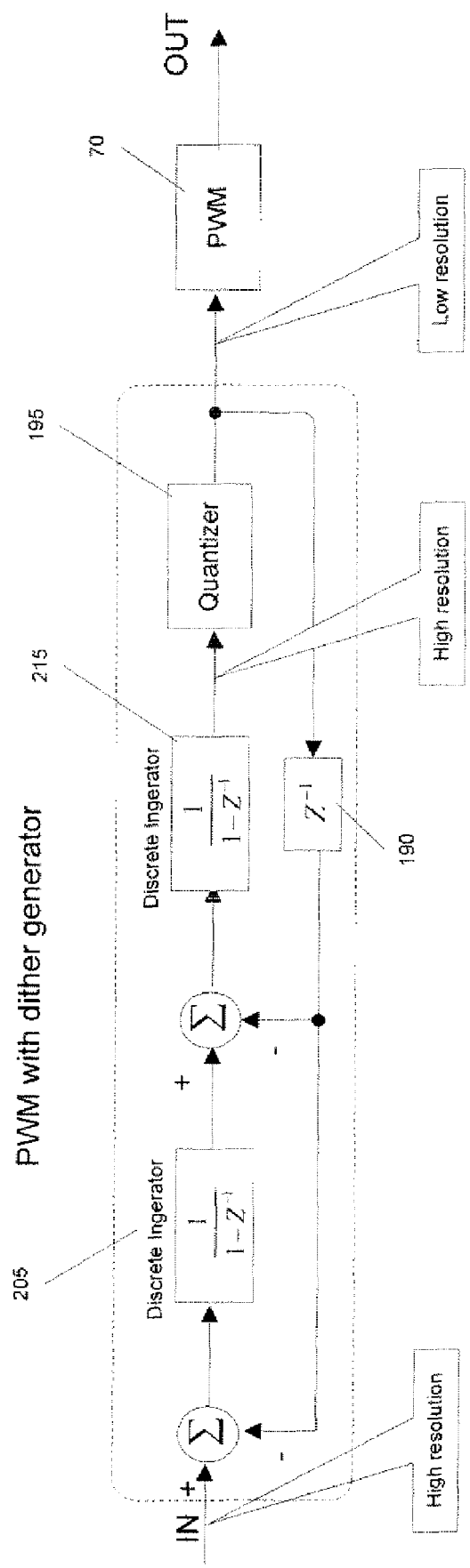
FIG. 12 shows a block diagram representation of yet another embodiment of a digital controller of these teachings.

FIG. 12 shows a block diagram representation of yet another embodiment of a digital controller of these teachings. In the embodiment shown in FIG. 12, the dither generating component 180 includes a quantizer 195 component that generates the dither output signal, a delay component 190 that receives the dither output signal (the delay component 190 is shown in terms of the z-transform of a delay) and provides a delayed dither output signal, a first discrete integrator component 205 capable of receiving a difference between the subsampled signal and the delayed dither output signal and also capable of providing a first discrete integrator output and a second discrete integrator 215 capable of receiving a difference between the first discrete integrator output and the delayed dither output signal and also capable of providing a second discrete integrator output to the quantizer 195.

It should be noted that, although a first order dither system is shown in FIG. 11 and a second order dither system is shown in FIG. 12, these teachings are not limited to only those embodiments and embodiments of higher-order dither systems are also within the scope of these teachings. In the embodiment in which the loop components are implemented in digital hardware, the component values are substantially precise and the output of the modulator is substantially stable.

During operation of the embodiment shown in FIG. 11 or in FIG. 12, the quantizer 195 removes the least significant bits from the input data path (the subsampled signal). The feedback loop (the loop from the output of the quantizer 195 back to providing the difference between the delayed quantizer output and the input subsampled signal) provides an average output that is equal to the full resolution input signal. The limit cycles are very high speed due to the pole locations of the feedback loop shown.

Figure 13A:
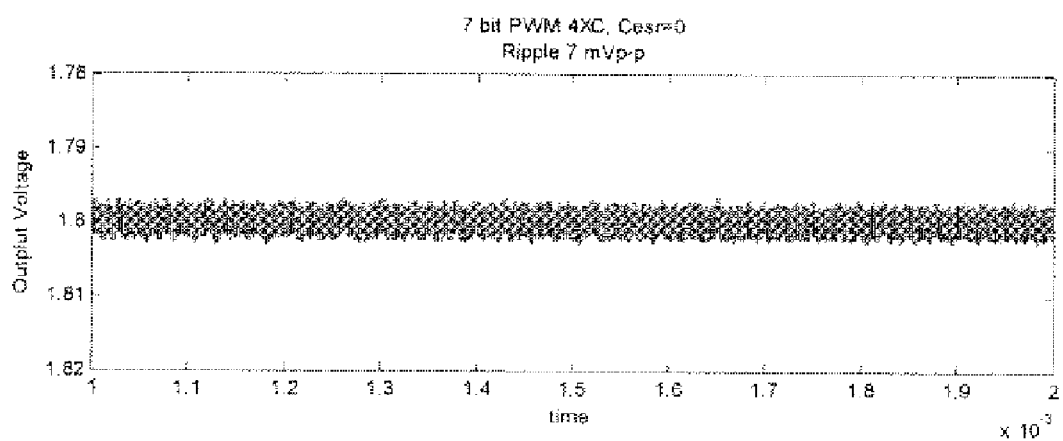
FIGS. 13a and 13b show a schematic graphical representation of results from simulation of an embodiment of these teachings.
Figure 13B:
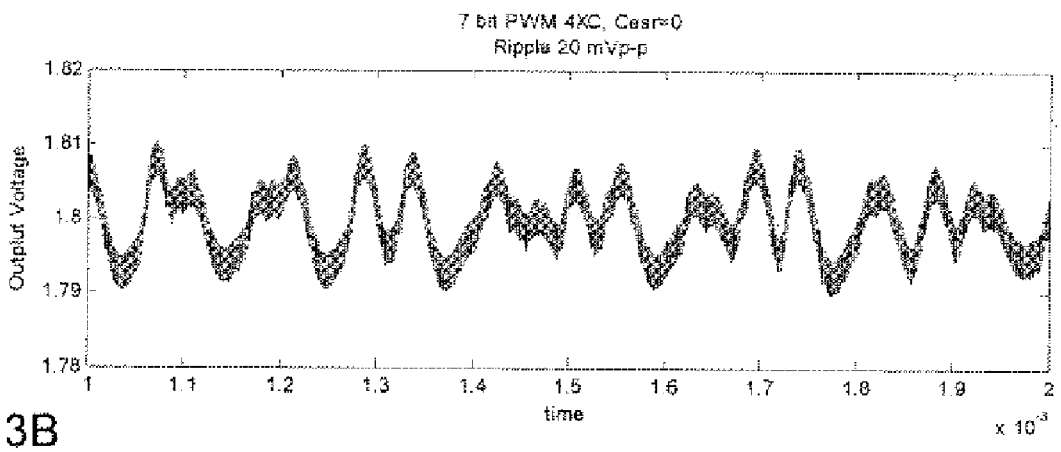

FIGS. 13a and 13b depict results from simulation of the embodiment of these teachings shown in FIG. 12. FIG. 13a shows simulation results for a closed loop controlled buck converter system including the dither generating component of FIG. 12. FIG. 13b shows results for a closed loop controlled buck converter system not including the dither generating component 180 of FIG. 12. In both cases a seven bits PWM is used. The results obtained in FIG. 13a would require a 10 bit PWM if the dither generating component is not included in the system.

It should be noted that embodiments of these teachings combining the dither generating component of FIG. 11 or 12 and the digital controller of any of FIGS. 3 through 10 are within the scope of this invention.

Figure 14:
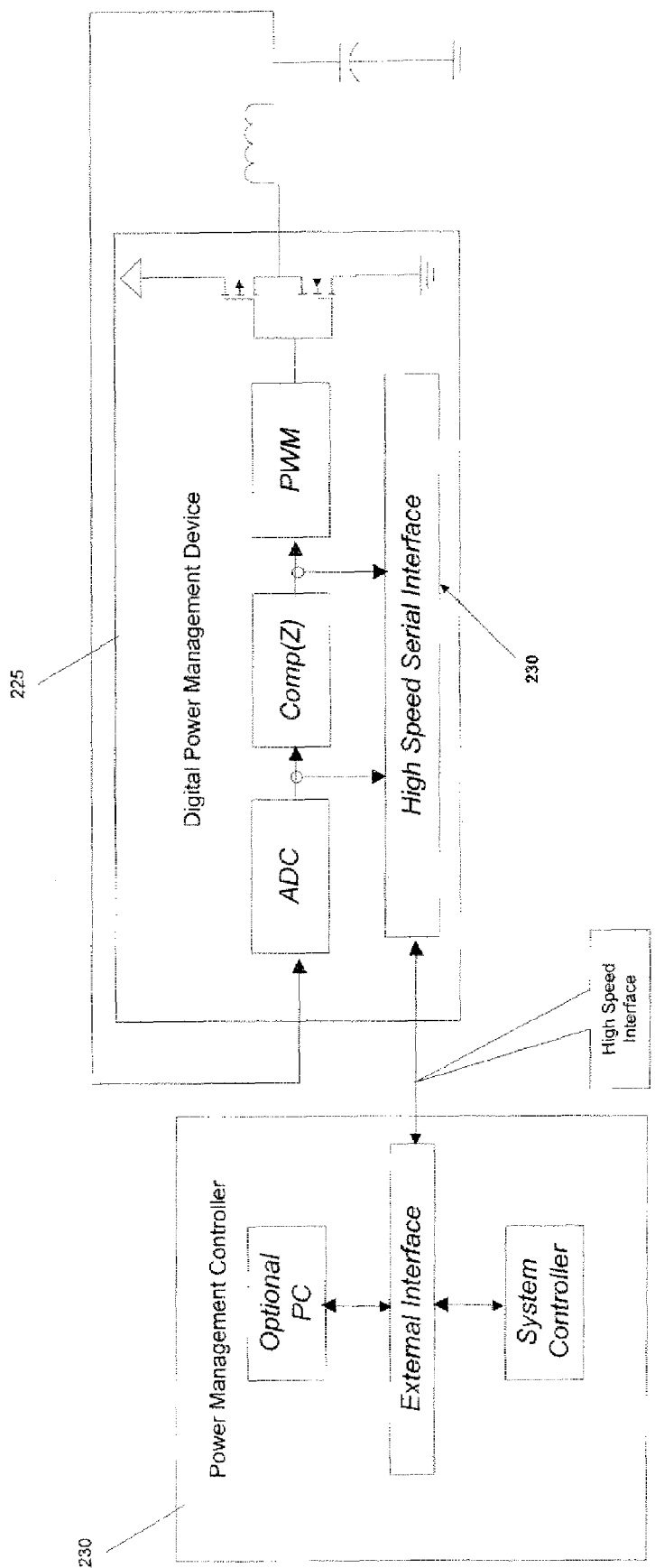
FIG. 14 shows a block diagram representation of an embodiment of a system of these teachings for collecting realtime performance data from a digital power management component.
Figure 15:
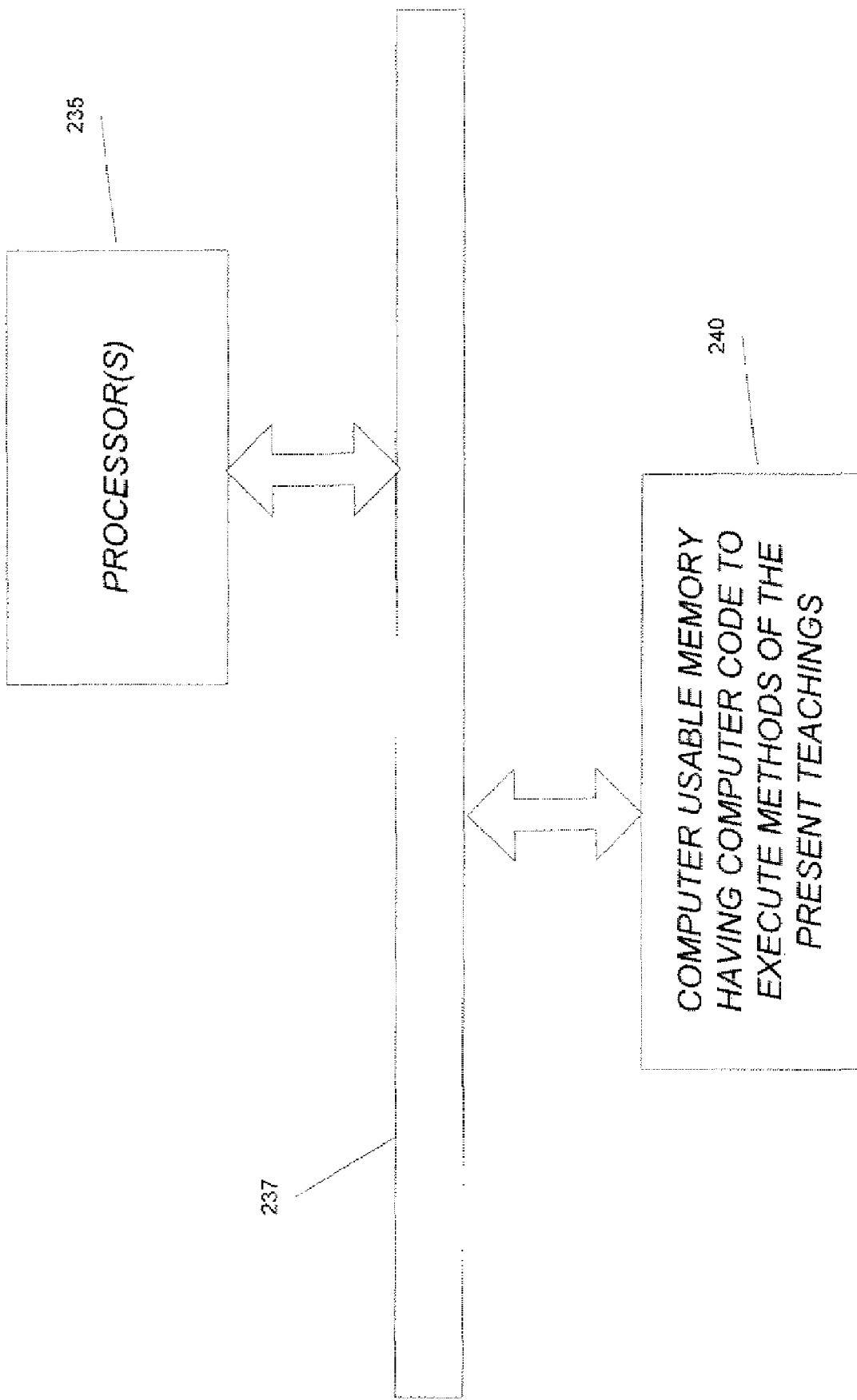
FIG. 15 shows a block diagram representation of a component of the embodiment shown in FIG. 14.

FIG. 14 shows a block diagram representation of an embodiment of a system of these teachings for collecting real-time performance data from a digital power management component. The embodiment shown in FIG. 14 includes a serial data transfer component capable of receiving/sending real-time data from/to a number of locations in the digital power management component 225 and a controller component 230 including (as shown in FIG. 15) one or more processors 235 and a computer usable medium 240 having computer readable code embodied therein, the computer readable code being capable of causing the one or more processors to collect, during operation of the digital power management component, real-time data from at least one location in the digital power management component and/or provide real-time data to at least one other location in the digital power management component. (In one embodiment, the one or more processors 235 and the computer usable medium 240 are operatively connected by means of a connection component 237. The connection component 237 may be, for example, a computer bus, or a carrier wave.)

During operation of the embodiment shown in FIG. 14, after a serial data transfer component 220 capable of receiving/sending real-time data from/to a number of locations in the digital power management component 225 is provided, real-time data from at least one location in the digital power management component is collected and provided to the controller component 230. In another instance, real-time data is provided to at least one location in the digital power management component 225.

Figure 16:
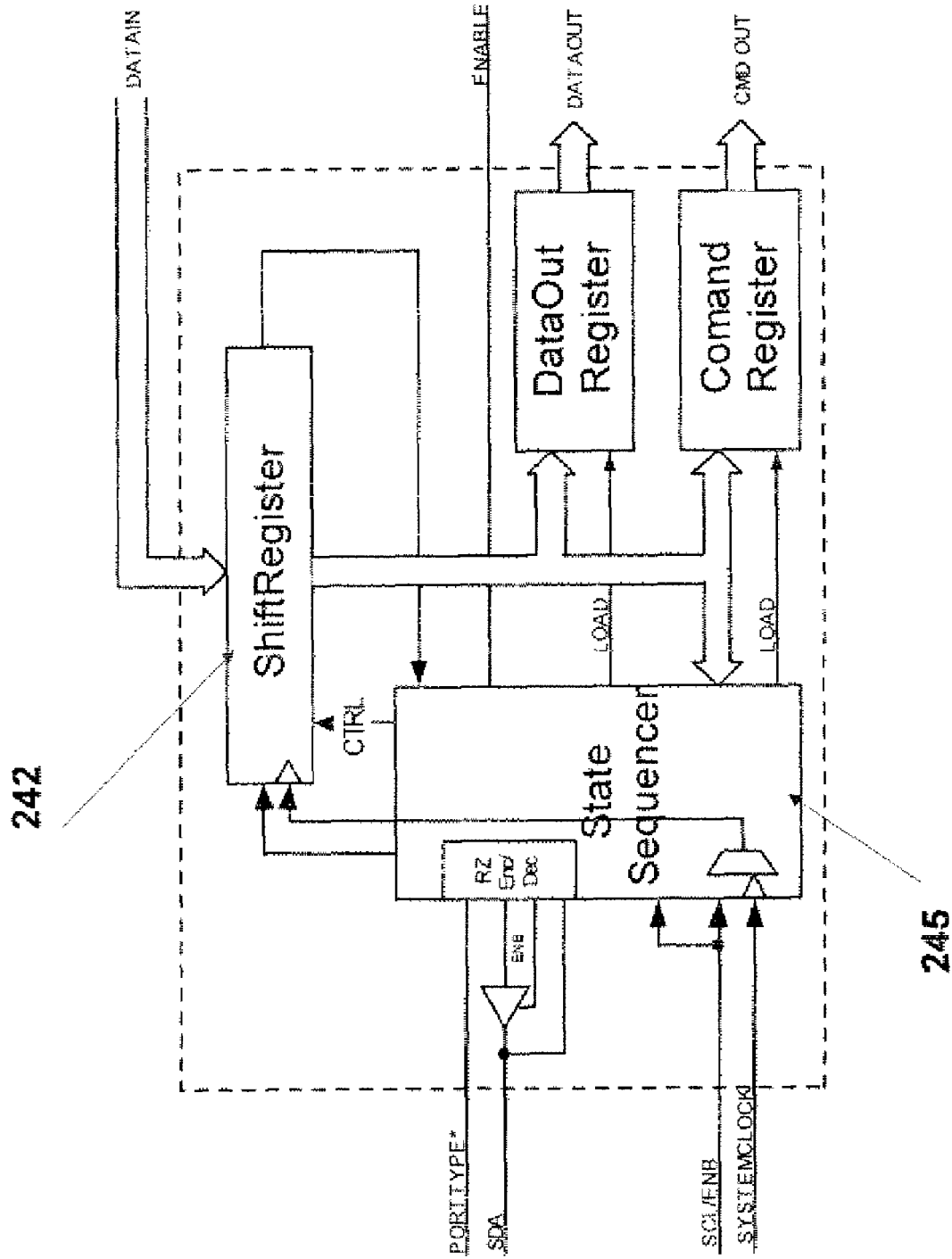
FIG. 16 shows a block diagram representation of an embodiment of a component of the system shown in FIG. 14.
Figure 17:
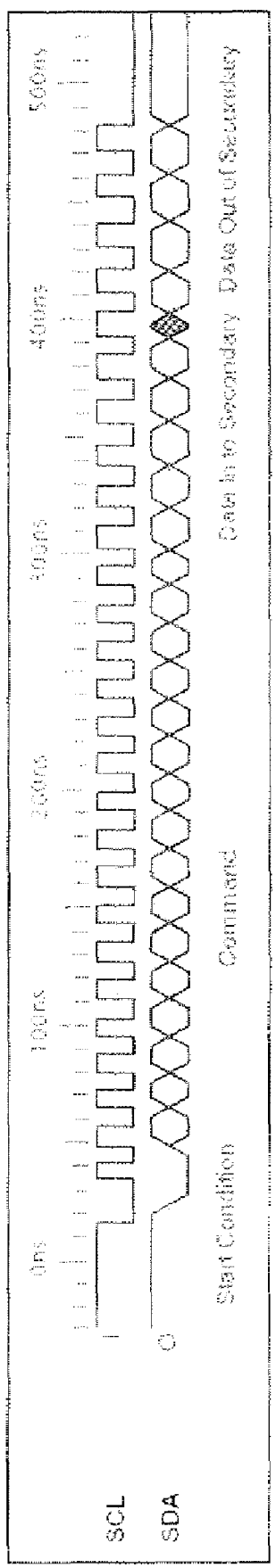
FIG. 17 shows a schematic graphical representation of timing for data transfer utilizing the embodiment shown in FIG. 16.

In one embodiment, shown in FIG. 16, the serial data transfer component 220 includes a shift register 242 with parallel load, a state sequencer 245 responsible for loading data into and out of the shift register. The serial data transfer component 220 includes a clock terminal (SCL) and a data terminal (SDA). During operation of the embodiment shown in FIG. 16, the receiving/sending component 230 is synchronized to the serial data transfer component 220 and the interface is point to point. In the embodiment shown in FIG. 16, this is accomplished by using the SCL pin as the clock synchronization source for the receiving/sending component 230. A transaction is initiated by a high to low transition on SCL while SDA is high (opposite of the conventional Inter-IC interface start). This selects SCL as the serial port clock source instead of the internal clock reference of the receiving/sending component 230. A 16 bit command word is sent containing the desired data format, specifically the field to be sent by receiving/sending component 230 and the field to be received by receiving/sending component 230. After this is complete, the serial port of the receiving/sending component 230 receives its first data field, changes the direction of the bus and sends its first data field. This continues until a hardware reset occurs. FIG. 17 depicts a timing for an exemplary (these teachings not being limited to this example) operation.

In another embodiment of the operation of shown in FIG. 16, in conventional Inter-IC interface mode, a start condition is declared by a high to low transition on SDA while SCL is high. The conventional Inter-IC interface protocol is implemented for the remainder of the transaction including the stop condition where a low to high transition on SDA occurs while SCL is high. The tri-state output on the SDA pin is used to emulate the open-collector output defined in the conventional Inter-IC interface specification. The advanced serial port modes are selected with a sequence of conventional Inter-IC interface commands.

In yet another embodiment of the operation of shown in FIG. 16, in a single wire mode based on the Inter-IC data format, Return to Zero (RZ) data encoding is used to eliminate the need for clock recovery (this is tantamount to using an internal clock as a clock reference). This mode of operation is intended for products that are pin limited but require simple internal adjustments. The State Sequencer block contains the RZ encoder/decoder and is a bond option in silicon. This design uses a true CMOS driver capable of driving high or low, which results in a higher data rate.

Figure 18:
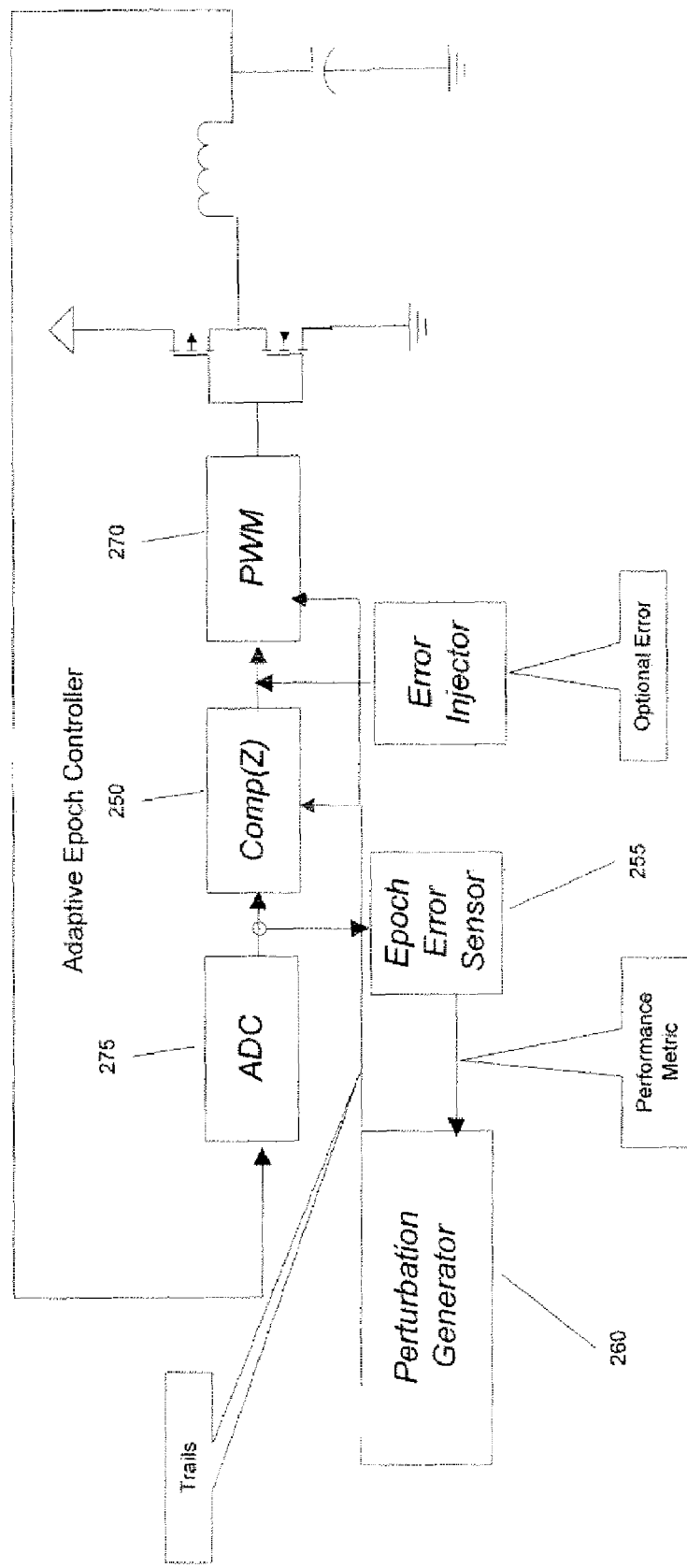
FIG. 18 shows a block diagram representation of a further embodiment of a component of the digital controller of these teachings.

FIG. 18 shows a block diagram representation of a further embodiment of a component of the digital controller of these teachings. The embodiment shown in FIG. 18 includes a compensating filter component 250 capable of receiving a digital input signal and of providing a compensated digital signal; the compensating filter component 250 having at least one parameter available for adjustment, an error performance filter 255 capable of receiving the digital input signal and of providing a performance indicative signal and a perturbation generating component 260 capable of receiving the performance indicative signal and of providing values, to the compensating filter component 250, for the one or more parameters available for adjustment. In one instance, the values provided are only a substantially small adjustment away from a previously known value (such as the preceding value). In one instance, the error performance filter 255 is a filter obtaining the absolute value of the squared error. In another instance, the error performance filter 255 is a filter generating a signal indicative of power dissipation. It should be noted that these teachings are not limited to the two embodiments of the error performance filter 255 disclosed above. In yet another instance, the values provided are obtained utilizing random perturbations. In another instance, the values provided are obtained by means of a predetermined algorithm (for example, but not limited to, a gradient search algorithm).

Figure 19:
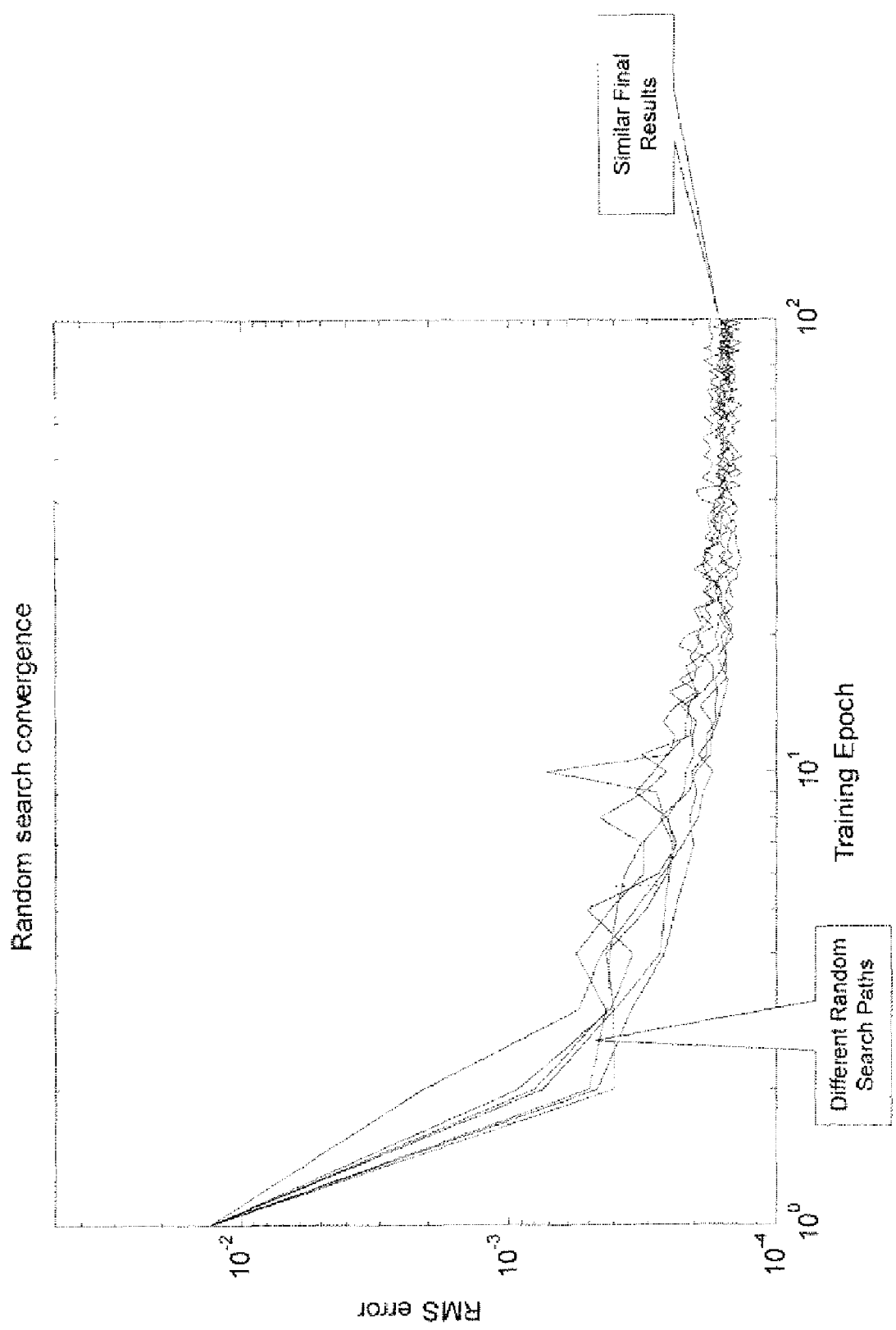
FIG. 19 shows a schematic graphical representation of results from simulation of the embodiment of FIG. 18.

In the embodiment shown in FIG. 18, the system also includes a pulse width modulator 270 having at least one adjustable parameter. The pulse width modulator 270 receives values of the one or more adjustable parameters from the perturbation generating component 260. The system shown in FIG. 18 also includes an analog to digital converter 275. FIG. 19 shows a schematic graphical representation of results from simulation of the embodiment of FIG. 18.

It should be noted that the pulse width modulators in the above described embodiments can include, but are not limited to, the pulse width modulators described in Syed, A, Ahmed, E., Maksimovic, D., Alarcon, E., *Digital pulse width modulator architectures*, PESC 04, 2004 IEEE 35th Annual Power Electronics Specialists Conference, 2004, 20-25 Jun. 2004, Volume 6, Pages: 4689-4695 and in O'Malley, E., Rinne K., *A programmable digital pulse width modulator providing versatile pulse patterns and supporting switching frequencies beyond* 15 *MHz*, APEC '04, Nineteenth Annual IEEE Applied Power Electronics Conference and Exposition, 2004, Volume 1, Pages: 53-59, both of which are incorporated by reference herein, and in the references provided therein. The above described embodiments can be, but are not limited to being, implemented with conventional digital components (or conventional digital "cells" in an integrated embodiment), and conventional ADCs and DACs.

Although the above embodiments have been described in terms of a particular controlled component, it should be noted that the above embodiments can be applied to a wide range of other controlled components.

Common forms of computer-readable (computer usable) media include, for example, a floppy disk, a flexible disk, hard disk, magnetic tape, or any other magnetic medium, a CDROM, any other optical medium, punched cards, paper tape, any other physical medium with patterns of holes or other patterns, a RAM, a PROM, and EPROM, a FLASH-EPROM, any other memory chip or cartridge, a carrier wave, such as electromagnetic radiation or electrical signals, or any other medium from which a computer can read.

Although the invention has been described with respect to various embodiments, it should be realized this invention is also capable of a wide variety of further and other embodiments within the spirit and scope of the appended claims.

What is claimed is:

1. A digital controller comprising:
   a modulating component capable of receiving an analog signal and providing an oversampled signal;
   a compensating filter having a transfer function obtained from a predetermined portion of a transfer function of a predetermined compensating filter in a feedback compensator; said compensating filter being capable of receiving the oversampled signal;
   a low pass filter capable of receiving an output from said compensating filter and of providing a low pass filter output having substantially reduced amplitude at a frequency greater than a predetermined frequency; and
   a sub sampling component capable of receiving the low pass filter output and of providing a subsampled output, the subsampled output having a subsampled rate lower than a rate of the oversampled signal.

2. The digital controller of claim 1 further comprising:
   another compensating filter capable of receiving the subsampled output and of providing a compensator output at the subsampled rate;
   a filter substantially equivalent to said compensating filter and said another compensating filter at the subsampled rate being a predetermined compensating filter.

3. The digital controller of claim 2 further comprising:
   a digital pulse width modulator capable of receiving the compensator output at the subsampled rate and of providing a plurality of pulse control pulses.

4. The digital controller of claim 2 wherein said compensating filter is obtained from a numerator of a predetermined compensating filter.

5. The digital controller of claim 4 wherein said another compensating filter is substantially a discrete integrator; and wherein said predetermined compensating filter is substantially a PID (proportional-integral-derivative) compensating filter.

6. The digital controller of claim 1 further comprising:
   a digital pulse width modulator capable of receiving the compensator output at the subsampled rate and of providing a plurality of pulse control pulses.

7. The controller of claim 1 wherein said compensating filter comprises:
   a plurality of sub-filters; each one output of each sub-filter from said plurality of sub-filters being multiplied by a value from a plurality of values, each one output of each sub-filter after being multiplied by said value being one weighted outputs from a plurality of weighted outputs; and
   the output from said compensating filter being a sum of said plurality of weighted outputs.

8. The digital controller of claim 1 wherein said modulating component is a Sigma Delta modulator.

9. The digital controller of claim 1 wherein said modulating component comprises:
   a sample and hold component receiving the analog signal;
   a repeating ramp generator; an output of said repeating ramp generator being subtracted from an output of said sample and hold component; and
   a comparator receiving a signal resulting from subtracting the output of said repeating ramp generator from the output of said sample and hold component;
   an output of said comparator being said oversampled signal.

10. The digital controller of claim 9 wherein said repeating ramp generator comprises a voltage controlled oscillator.

11. The digital controller of claim 10 wherein said voltage controlled oscillator is a resettable oscillator.

12. The digital controller of claim 9 wherein said modulating component comprises a resetting component capable of resetting said modulating component to lower resolution.

13. The digital controller of claim 1 wherein said modulating component comprises;
   a low resolution analog to digital converting component; an output of said low-resolution analog-to-digital converting component being the oversampled signal;
   a discrete integrator receiving the oversampled signal; and
   a high. resolution digital to analog converting component; said high-resolution digital to analog converting system receiving an output of said discrete integrator;
   said low-resolution analog-to-digital converting component receiving a signal comprising a difference between the analog signal and an output of said high-resolution digital to analog converting component.

14. The digital controller of claims 13 wherein said compensating filter and said low pass filter comprise a discrete integrator.

15. The digital controller of claim 1 wherein said modulating component comprises;
   a low resolution analog to digital converting component
   a variable gain component capable of receiving an output of said low-resolution analog to digital converting component and of providing a variable gain component output substantially equal to a variable multiplying factor times the output of said low-resolution analog-to-digital converting component; said variable gain component being also capable of receiving a gain setting signal and of modifying said variable multiplying factor in response to said gain setting signal; said variable gain component output being the oversampled signal;
   a discrete integrator receiving the variable gain component output; and
   a high. resolution digital to analog converting system; said high-resolution digital to analog converting system receiving an output of said discrete integrator;
   said low-resolution analog-to-digital converting system receiving a signal comprising a difference between the analog signal and an output of said high-resolution digital to analog converting system.

16. The digital controller of claim 15 wherein said compensating filter and said low pass filter comprise a discrete integrator.

17. The digital controller of claim 1 further comprising:
   a dither generating component capable of receiving the subsampled signal and of providing a dither output signal having a lower time resolution than the subsampled signal resolution; an average of the dither output signal being substantially equivalent to the subsampled signal; and
   a digital pulse width modulator capable of receiving the dither output signal and of providing a plurality of pulse control pulses; said dither output signal determining at least one characteristic of said plurality of pulse control pulses.

18. The controller of claim 17 wherein said dither generating component comprises:
   a quantizer component capable of generating the dither output signal;
   a delay component capable of receiving the dither output signal and of providing a delayed dither output signal; and a discrete integrator component capable of receiving a difference between the input signal and the delayed dither output signal and also capable of providing a discrete integrator output to said quantizer.

19. The digital controller of claim 17 wherein said dither generating component comprises:
   a quantizer component capable of generating the dither output signal;
   a delay component capable of receiving the dither output signal and of providing a delayed dither output signal; and
   a first discrete integrator component capable of receiving a difference between the subsampled signal and the delayed dither output signal and also capable of providing a first discrete integrator output; and
   a second discrete integrator capable of receiving a difference between the first discrete integrator output and the delayed dither output signal and also capable of providing a second discrete integrator output to said quantizer.

20. A method for digital control, the method comprising the steps of:
   oversampling an analog signal;
   filtering the oversampled signal with a compensating filter said compensating filter having a transfer function obtained from a predetermined portion of a transfer function of a predetermined compensating filter in a feedback compensator; and
   low pass filtering and decimating the oversampled signal after filtering with the compensating filter, the decimating resulting in a decimated signal.

21. The method of claim 20 further comprising the step of:
   filtering, after decimating, the decimated signal with another compensating filter.

22. An analog to digital converter (ADC) comprising:
   a modulating component comprising;
      a low resolution analog to digital converting component
      a variable gain component capable of receiving an output of said low-resolution analog to digital converting component and of providing a variable gain component output substantially equal to a variable multiplying factor times the output of said low-resolution analog-to-digital converting component; said variable gain component being also capable of receiving a gain setting signal and of modifying said variable multiplying factor in response to said gain setting signal; said variable gain component output being the oversampled signal;
      a discrete integrator receiving the variable gain component output; and
      a high. resolution digital to analog converting system; said high-resolution digital to analog converting system receiving an output of said discrete integrator;
      said low-resolution analog-to-digital converting system receiving a signal comprising a difference between the analog signal and an output of said high-resolution digital to analog converting system.

23. The ADC of claim 22 further comprising a decimator.

* * * * *

UNITED STATES PATENT AND TRADEMARK OFFICE
CERTIFICATE OF CORRECTION

PATENT NO. : 7,466,254 B2
APPLICATION NO. : 11/550893
DATED : December 16, 2008
INVENTOR(S) : Paul Latham et al.

It is certified that error appears in the above-identified patent and that said Letters Patent is hereby corrected as shown below:

In column 9, line 21 (claim 2), "rate;" should read --rate; and--

In column 9, line 24 (claim 2), "being a predetermined" should read --being the predetermined--

In column 10, line 61 (claim 18), "The controller" should read --The digital controller--

In column 11, line 2 (claim 18), "the input signal" should read --the subsampled signal--

In column 12, line 17 (claim 22), "the oversampled" should read --an oversampled--

Signed and Sealed this

Seventeenth Day of February, 2009

JOHN DOLL
*Acting Director of the United States Patent and Trademark Office*